United States Patent [19]

Kowalski

[11] Patent Number: 5,442,589
[45] Date of Patent: Aug. 15, 1995

[54] FUSE CIRCUITRY HAVING PHYSICAL FUSE AND NON-VOLATILE MEMORY CELL COUPLED TO A DETECTOR

[75] Inventor: Jacek Kowalski, Trets, France

[73] Assignee: Gemplus Card International, Gemenos, France

[21] Appl. No.: 143,185

[22] Filed: Oct. 26, 1993

[30] Foreign Application Priority Data

Oct. 29, 1992 [FR] France .................. 92 12969

[51] Int. Cl.[6] ............................................. G11C 17/16
[52] U.S. Cl. ............................ 365/225.7; 365/185; 365/200; 365/96; 365/104
[58] Field of Search .............. 365/225.7, 185, 189.07, 365/200, 96, 104; 235/492

[56] References Cited

U.S. PATENT DOCUMENTS

| | | | |
|---|---|---|---|
| 4,198,696 | 4/1980 | Bertin et al. | 365/175 |
| 4,725,980 | 2/1988 | Wakimoto et al. | 365/185 |
| 5,233,566 | 8/1993 | Imamiya et al. | 365/230.08 |
| 5,247,476 | 9/1993 | Kasa | 365/104 |
| 5,291,139 | 3/1994 | Fruhauf et al. | 324/550 |
| 5,291,434 | 3/1994 | Kowalski | 365/96 |
| 5,300,840 | 4/1994 | Drouot | 307/530 |

FOREIGN PATENT DOCUMENTS 0161947 11/1985 European Pat. Off.
0408419 1/1991 European Pat. Off.

Primary Examiner—Joseph A. Popek
Assistant Examiner—Andrew Q. Tran
Attorney, Agent, or Firm—Nilles & Nilles

[57] ABSTRACT

A fuse circuit including: a physical fuse; a detection circuit for the detection of the state of the physical fuse; and an electrically programmable non-volatile memory cell associated with the physical fuse, programmed when the physical fuse is blown and connected to the detection circuit so that, when the electrically programmable non-volatile memory cell is programmed, the electrically programmable non-volatile memory cell confirms the blown state of the physical fuse even if the characteristics of the blown state of the physical fuse change with time.

20 Claims, 1 Drawing Sheet

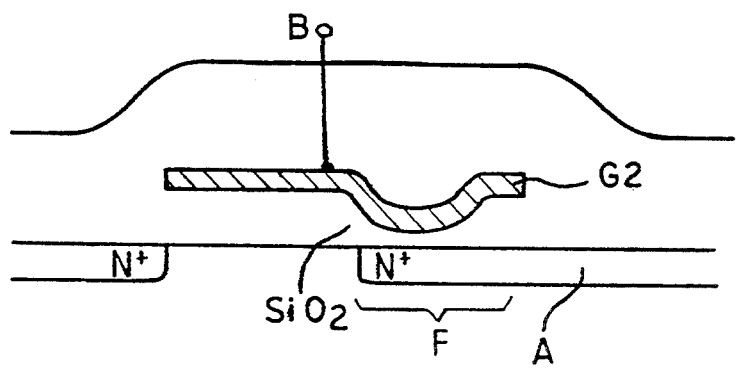
FIG_1
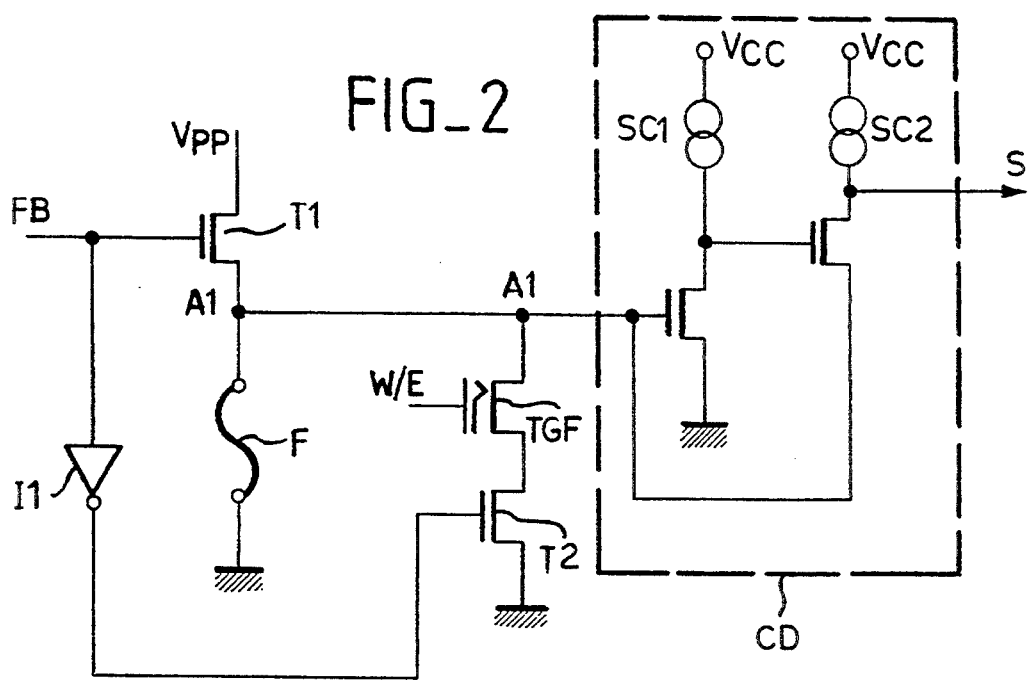
FIG_2
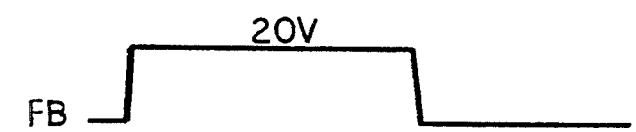
FIG_3
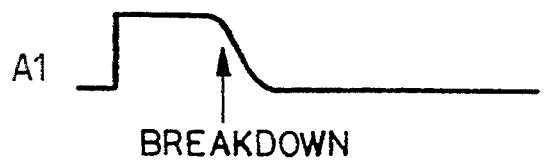

FUSE CIRCUITRY HAVING PHYSICAL FUSE AND NON-VOLATILE MEMORY CELL COUPLED TO A DETECTOR

BACKGROUND OF THE INVENTION

1. Field of the Invention

The invention relates to integrated circuits and, more particularly, to those comprising one or more physical fuses.

A physical fuse is a circuit element having an initial structure that can be destroyed irreversibly to give it a final structure with different properties. The initial structure is, for example, an insulator structure and the final structure is a conductive or resistive structure. Alternatively, the initial structure is conductive or resistive and the destruction of the fuse givers it an insulator structure.

The destruction is generally done either by a laser beam directed towards the fuse to make it melt or by an electrical blowing circuit capable of applying a current and/or voltage to the fuse that modifies its structure.

2. Description of the Prior Art

An example of a fuse is described in the patent application No. EP-A-0 408 419. This fuse is constituted by a very thin insulating layer between two conductors. It is blown by the application of a high voltage (on the order of 20 volts) between the conductors with a current of some milliamperes for some tens of milliseconds. The insulator layer then becomes resistive. The state of the fuse (whether intact or blown) is detected by a circuit that measures the current flowing through the fuse. This circuit is used to control other elements of the integrated circuit in which the fuse is inserted. The fuse is used, for example to irreversibly block the access to a non-volatile memory zone in the integrated circuit.

This type of fuse is frequently encountered in chip cards. Although the invention is not limited to fuses for chip card circuits, chip cards illustrate a problem that may be encountered with respect to fuses: these cards are thin and can therefore get twisted, giving rise to severe mechanical strains in the integrated circuit chip. In the case of the fuse indicated here above, the strains may lead to the destruction of the resistive connection set up during the blowing of the fuse. The fuse may thus return to a state close to its intact state, even though it had been blown in a way that was supposed to be irreversible. In other fuse structures, the strains may give rise to defects of the same type, namely defects by which a fuse returns to a state where it is equivalent to an intact fuse or by which an intact fuse behaves like a blown fuse.

This situation is not acceptable even if the probability of its occurring is low.

To improve the reliability of integrated circuits with physical fuses, the invention proposes the association, with the fuse, of an electrically programmable non-volatile memory cell, that is programmed at the same time as the fuse is blown. The state of the fuse is confirmed by the state of the memory. In particular, the blown state of the fuse may be confirmed by the programmed state of the memory in the applications where it is necessary to ensure that the circuit can continue to preserve the functions defined by the blown state of the fuse. If the blown structure subsequently takes on the characteristics of the intact structure in varying degrees, then the memory cell will take the place of the defective fuse.

SUMMARY OF THE INVENTION

Consequently, expressed in another way, the invention proposes a fuse circuit comprising a physical fuse and a circuit for the detection of the state of the fuse, said fuse circuit further comprising an electrically programmable non-volatile memory cell, associated with the fuse and programmed when the fuse is blown, the memory cell being connected to the detection circuit so that, when it is programmed, it confirms the blown state of the fuse even if the characteristics of the blown fuse change in the course of time.

The invention is applicable chiefly to fuses that can be blown electrically. It is particularly suited to insulator-blowing fuses.

A single blowing circuit is preferably designed to achieve the blowing of the physical fuse and, the programming of the associated cell, with a single blowing command.

The blowing circuit preferably has a first transistor connected between a blowing voltage source and the fuse, said fuse being further connected to a ground, to apply a blowing voltage to the physical fuse. The memory cell is a floating-gate transistor connected firstly to the fuse and secondly to a control transistor, said transistor being further connected to the ground.

The control transistor is made conductive outside the stage of programming of the memory.

The common node connecting the fuse and the floating-gate transistor is further connected to a detection circuit that makes it possible to detect the state of the fuse. This circuit is preferably a circuit to measure the sum of the currents that flow through the fuse and the memory cell.

BRIEF DESCRIPTION OF THE DRAWINGS

Other particular features and advantages of the invention shall appear from the following description, given by way of a non-restrictive illustration with reference to the appended drawing wherein:

FIG. 1 shows an oxide blowing circuit;

FIG. 2 shows the fuse, its associated memory cell and the common blowing circuit; and FIG. 3 shows the timing diagrams associated with FIG. 2.

MORE DETAILED DESCRIPTION

One fuse to which the present invention can be applied is that of FIG. 1; the fuse F is constituted by two conductors A and B separated by a locally thinned layer of insulator (with a thickness of the order of 100 angstroms at the place of the thinning). The insulator layer breaks down and becomes resistive in the presence of an adequate electrical field (about 20 volts between the conductors A and B, corresponding to an electrical field of about 20 million volts per cm).

In order that the fuse may be made easily with memories using floating-gate transistors, or similar technology the conductor A is made as a drain of a floating gate transistor, i.e. by an N+ type diffusion in a monocrystalline semiconductor substrate; the conductor B is made out of the gate G2 of a floating-gate transistor. The gate is made of polycrystalline silicon and forms the conductor B. The local thinning of oxide is located above the N+ diffusion.

It is of course possible here to have a transistor with two polycrystalline silicon gates that are electrically connected to form the conductor B.

Other details of this fuse (which is given only by way of an example) can be found in the patent No. EP-A-0 408 419 already mentioned.

FIG. 2 shows a diagram of the blowing and detection circuit associated with this fuse and with, the improvement according to the invention.

The simplest blowing circuit comprises a transistor T1, the source (node A1) of which is connected to the fuse F which is furthermore connected to the ground. A blowing command may be given by the application of a blowing signal FB to the gate of T1 while at the same time taking the drain of T1 to a sufficient blowing voltage Vpp.

To carry out the blowing of the fuse, the voltage Vpp is made to rise from a normal low value (for example 5 volts) to a higher value, (for example about twenty volts). Simultaneously, the signal FB is made to rise from 0 to about 20 volts. The transistor T1 becomes conductive, the voltage of 20 volts is applied to the fuse, the fuse blows, the voltage at its terminals falls to a low value (for example two volts on the node A1), and the voltage Vpp then drops generally to a reduced value owing to the fact that the source of blowing voltage that gives Vpp can hardly give a high blowing current and at the same time keep its value of 20 volts.

A detection circuit CD, connected to the fuse F by the node A1, then enables the detection of the state of the fuse, namely whether or not it has blown. This detection is accomplished by measuring the current consumed at the node A1: in the intact state, no current goes through the node A1 towards the ground; in the blown state, the fuse is resistive and a current flows. This current is detected by the circuit CD which gives a logic signal at its output S depending on the existence of sufficient current.

The present invention also utilizes a non-volatile memory cell to confirm the state of the fuse. The state of this cell will be detected by the same detection circuit CD. If the fuse no longer lets through sufficient current despite the fact that it has blown, then the memory cell should let through sufficient current. The detection circuit then reacts as if the fuse works normally.

If the fuse is of the type that lets through a current when it is blown, the memory cell should be connected in such a way that it too lets through a current, and in such a way, that is mounted in parallel with the fuse. This is done in assuming, of course, that the state to be confirmed is the blown state and not the intact state. It is possible, however, to conceive of a circuit that uses a memory cell placed in series with the fuse, should the fuse be of the type that is an insulator in the blown state (again so that the memory cell may confirm the blown state of the fuse).

In the exemplary embodiment described in FIG. 2, a memory cell TGF is connected to the node A1. This cell is preferably an EEPROM type floating-gate transistor that can be erased or programmed electrically. This transistor is preferably made of a technology similar to that of the fuse of FIG. 1, however, the gates G1 and G2 are not short-circuited so that the gate G2 remains in a floating state.

The drain of the transistor TGF is connected to the node A1, the source is connected to the ground by means of a control transistor T2 and the gate of the transistor TGF may be controlled notably by an erasure signal W/E.

The transistor T2 is notably conductive, except during the simultaneous operation of blowing the fuse and programming the memory cell. Its gate is controlled by the logic complement of the break-down signal FB; a logic level of 0 to 5 volts is sufficient, however, to control T2. Symbolically, an inverter I1 has been shown between the signal FB and the gate of T2.

The blowing operation is carried out according to the graphs shown in FIG. 3. The blowing of the fuse G is identical to what has been explained here above, i.e. the presence of the memory cell TGF does not have an influence on the blowing; the diagrams of FIG. 3 are applicable.

The gate of the transistor TGF, for its part, is kept at 0 during the blowing (W/E=0).

During the rise of the voltage Vpp to a value of about 20 volts, the transistor TGF is programmed, i.e. electrons are extracted from its floating gate (if necessary, the transistor could have been erased beforehand, i.e. it could have been charged with electrons as shall be seen further below). The transistor TGF is indeed under conditions of programming with the drain at 20 volts, the source insulated by the non-conductive transistor T2 and the gate at 0 volts. Since the programming of the floating-gate transistor takes place within a period of time (some milliseconds) that is shorter than the time taken for the blowing of the fuse (5 to 20 milliseconds), this programming is done before the potential of the node A1 drops under the effect of the blowing.

The memory cell is therefore programmed simultaneously with the blowing of the fuse, by a single blowing command FB.

After programming, the signal FB goes to zero; the signal W/E is taken to a voltage that is slightly greater than 0 (from 1 to 5 volts) to keep the cell under reading conditions. However, if the programming operation has charged the floating gate sufficiently for the transistor TGF to have a negative threshold voltage, the voltage W/E can be left at 0.

A current IF flows through the fuse F and a current Im flows through the floating-gate transistor TGF.

The sum of the currents If and Im is compared, in the detection circuit CD, with a threshold Iref. A logic signal indicating an intact fuse is given on the output S if the sum of the currents is lower than the current Iref; a reverse logic signal indicating a blown fuse is given if the sum of the currents is greater than this threshold.

The current Iref is chosen such that the blown fuse signal appears when the sum of the currents measured is greater than the nominal current flowing in the programmed cell.

This means that even if the fuse has become highly resistive, the detection circuit will again detect the equivalent of a blown fuse. No special problems are raised if the blowing of the fuse is designed to validate a functioning of the circuit after several customizing operations. In general, however, it is necessary to be able to carry out real tests on the state of the fuse, at least at certain times (for example before the customizing stage). For this purpose, an erasing the memory cell is provided.

To erase the cell, a voltage of about twenty volts is applied to the floating gate by erasure signal W/E, the transistor T2 being conductive (FB=0).

Then the cell no longer lets through any current and the detection circuit will be truly capable of ascertaining that the fuse F is intact, and of permitting the corresponding operations in the circuit (for example the storage of non-accessible data elements in the case of a circuit for chip cards). It is only after this phase that the blowing of the fuse and the simultaneous programming of the memory cell will be carried out.

What is claimed is:

1. A fuse circuit comprising:
   a physical fuse;
   a detection circuit for the detection of the state of the physical fuse; and
   an electrically programmable non-volatile memory cell associated with the physical fuse, programmed when the physical fuse is blown and connected to the detection circuit so that, when the electrically programmable non-volatile memory cell is programmed, the electrically programmable non-volatile memory cell confirms the blown state of the physical fuse even if the characteristics of the blown state of the physical fuse change with time.

2. A fuse circuit according to claim 1, wherein the physical fuse is an insulator fuse in the intact state and is conductive in the blown state.

3. A fuse circuit according to claim 2, wherein the physical fuse is an insulator fuse in the intact state and is resistive in the blown state.

4. A fuse circuit according to claim 1, further comprising an electrical blowing circuit for the blowing of the physical fuse that can be activated by a blowing command signal, wherein the electrically programmable non-volatile memory cell is connected to a programming circuit that receives the blowing command signal.

5. A fuse circuit according to claim 4, wherein the electrical blowing circuit comprises a transistor connected between a blowing voltage source and the physical fuse, said physical fuse being connected to a ground potential.

6. A fuse circuit according to claim 1, wherein the electrically programmable non-volatile memory cell comprises a floating-gate transistor.

7. A fuse circuit according to claim 6, wherein the floating-gate transistor is connected to a terminal of the physical fuse capable of receiving a programming voltage and to a control transistor, a drain of the control transistor being connected to a ground potential.

8. A fuse circuit according to claim 7, wherein the control transistor is conductive before a blowing stage and after the blowing stage so as to connect the floating-gate transistor to the ground potential and to receive, during the blowing stage, a logic complement of a break-down signal.

9. A fuse circuit according to claim 1, wherein the physical fuse and the electrically programmable non-volatile memory cell are connected to a node, the physical fuse lets through a first current from the node towards a ground potential when the physical fuse is in the blow state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

10. A fuse circuit according to claim 2, further comprising an electrical blowing circuit for the blowing of the physical fuse that can be activated by a blowing command signal, wherein the electrically programmable non-volatile memory cell is connected to a programming circuit that receives the blowing command signal.

11. A fuse circuit according to claim 10, wherein the electrical blowing circuit comprises a transistor connected between a blowing voltage source and the physical fuse, said physical fuse being connected to a ground potential.

12. A fuse circuit according to claim 11, wherein the physical fuse and the electrically programmable non-volatile memory cell are connected to a node, the physical fuse lets through a first current from the node towards the ground potential when the physical fuse is in the blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

13. A fuse circuit according to claim 10, wherein the physical fuse and the electrically programmable non-volatile memory cell are connected to a node, the physical fuse lets through a first current from the node towards a ground potential when the physical fuse is in the blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

14. A fuse circuit according to claim 3, further comprising an electrical blowing circuit for the blowing of the physical fuse that can be activated by a blowing command signal, wherein the electrically programmable non-volatile memory cell is connected to a programming circuit that receives the blowing command signal.

15. A fuse circuit according to claim 14, wherein the electrical blowing circuit comprises a transistor connected between a blowing voltage source and the physical fuse, said physical fuse being connected to a ground potential.

16. A fuse circuit according to claim 15, wherein the physical fuse and the electrically programmable non-volatile memory cell are connected to a node, the physical fuse lets through a first current from the node towards the ground potential when the physical fuse is in a blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

17. A fuse circuit according to claim 5, wherein the physical fuse and the electrically programmable non-volatile memory cell are connected to a node, the physical fuse lets through a first current from the node towards the ground potential when the physical fuse is in a blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

18. A fuse circuit according to claim 6, wherein the physical fuse and the electrically programmable non-volatile memory cell are connected to a node, the physical fuse lets through a first current from the node towards the ground potential when the physical fuse is in the blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

19. A fuse circuit according to claim 7, wherein the physical fuse and the electrically programmable non-volatile memory cell are connected to a node, the physical fuse lets through a first current from the node towards the ground potential when the physical fuse is in a blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

20. A fuse circuit according to claim 8, wherein the physical fuse and the electrically programmable non-volatile memory cell are connected to a node, the physical fuse lets through a first current from the node towards the ground potential when the physical fuse is in the blown state, the electrically programmable non-volatile memory cell lets through a second current from the node towards the ground potential when the electrically programmable non-volatile memory cell is in the programmed state and the detection circuit is connected to the node and comprises a circuit to measure current consumed by the node.

* * * * *